United States Patent [19]
Alini et al.

[11] Patent Number: 5,394,112
[45] Date of Patent: Feb. 28, 1995

[54] DIFFERENTIAL TRANSCONDUCTOR WITH REDUCED TEMPERATURE DEPENDENCE

[75] Inventors: Roberto Alini, Stradella; Francesco Rezzi, Vascovato; Gianfranco Vai, Pavia; Marco Gregori, Milan, all of Italy

[73] Assignee: SGS-Thomson Microelectronics, S.r.l., Agrate Brianza, Italy

[21] Appl. No.: 35,329

[22] Filed: Mar. 22, 1993

[30] Foreign Application Priority Data

Mar. 20, 1992 [EP] European Pat. Off. ............ 92830140

[51] Int. Cl.⁶ ............................ G05F 1/00; G05F 5/00
[52] U.S. Cl. .................................... 330/256; 330/289; 330/296
[58] Field of Search ............... 330/256, 289, 296, 258, 330/10

[56] References Cited

U.S. PATENT DOCUMENTS 4,723,108  2/1988  Murphy et al. ..................... 307/304

OTHER PUBLICATIONS

De Veirman et al., "Full-Integrated 5 to 15 MHZ Programmable Bipolar Bessel Lowpass Filter", Sep. 3, 1990, 1990 IEEE International Symposium on Circuits and Systems, pp. 1155–1158.

Glasford, "Current Developments in CMOS Gain-Stabalized Transconductance Amplifiers for High Frequency Bandpass Filter Applications", Jul. 12, 1983, IEEE International Symposium on Circuits and Systems, pp. 1282–1285.

Primary Examiner—William L. Sikes
Assistant Examiner—Fetsum Abraham
Attorney, Agent, or Firm—Robert Groover

[57] ABSTRACT

An integrated circuit transconductor stage which suppresses the dependence on temperature and production process variables of a differential transconductor stage. A negative feedback relation is used, where the output of the transconductor stage is connected to an additional current generator (which is referenced to a precision external resistor), to a capacitor, and also to the gate of a PMOS transistor which sources current to a polarization stage, which in turn sources current to the transconductor stage, or to multiple transconductor stages.

24 Claims, 4 Drawing Sheets

DIFFERENTIAL TRANSCONDUCTOR WITH REDUCED TEMPERATURE DEPENDENCE

CROSS-REFERENCE TO RELATED APPLICATION

This application claims priority from EPC App'n 92830140.7, filed 20 March 1992, which is hereby incorporated by reference.

BACKGROUND AND SUMMARY OF THE INVENTION

This invention relates to improved transconductor[1] stages, and particularly to integrated circuit transconductors having improved independence from temperature and from production process variables.

[1] A transconductor is a voltage-controlled current amplifier stage. An ideal transconductor provides an output current which is equal to its input voltage current multiplied by a transconductance $g_m$. (A transconductor having a high input impedance and a significant transconductance—i.e. a voltage-controlled current-source amplifier—may also be referred to as an "Operational Transconductance Amplifier" or "OTA".) Transconductors are used in active filters, and also in gyrators, oscillators, and circuits for impedance transformation. See generally J. Scott, ANALOG ELECTRONIC DESIGN (1991); A. Grebene, BIPOLAR AND MOS ANALOG INTEGRATED CIRCUIT DESIGN (1984); both of which are hereby incorporated by reference.

Continuous-Time Monolithic Filters

The disclosed innovations are particularly, but not exclusively, advantageous in continuous-time monolithic filters,[2] and the description that follows will make reference to this field of application for convenience of illustration. However, it must be noted that the improved parameters provided by the disclosed inventions are applicable to many other circuits and subcircuits.

[2] Some specific examples of the literature on transconductor designs, and their application to continuous-time filters, includes the following, all of which are hereby incorporated by reference: Silva-Martinez et al., "A large-signal very low-distortion transconductor for high-frequency continuous-time filters," IEEE JOURNAL OF SOLID-STATE CIRCUITS vol.26, no.7 p.946–55 (July 1991); Tanimoto et al., "Realization of a 1-V active filter using a linearization technique employing plurality of emitter-coupled pairs," IEEE JOURNAL OF SOLID-STATE CIRCUITS vol.26, no.7 p.937–45 (July 1991); Castello et al., "A very linear BiCMOS transconductor for high-frequency filtering applications," in the 1990 IEEE INTERNATIONAL SYMPOSIUM ON CIRCUITS AND SYSTEMS vol.2, pp.1364–7; Perry, "A flexible transconductor-capacitor filter demonstrator," in the 1989 IEEE INTERNATIONAL SYMPOSIUM ON CIRCUITS AND SYSTEMS vol.2, p.1075–8; Haigh et al., "Continuous-time and switched capacitor monolithic filters based on current and charge simulation," IEE PROCEEDINGS G (Circuits, Devices and Systems) vol. 137, no.2 p.147–55 (1990); de Heij et al., "Transconductor and integrator circuits for integrated bipolar video frequency filters," 1989 IEEE INTERNATIONAL SYMPOSIUM ON CIRCUITS AND SYSTEMS vol. 1 p. 114–17; Perry, "An integrated continuous-time bipolar transconductor-capacitor filter," 24 IEEE JOURNAL OF SOLID-STATE CIRCUITS p.732–5 (June 1989); Nedungadi et al., "High-frequency voltage-controlled continuous-time lowpass filter using linearised CMOS integrators," 22 ELECTRONICS LETTERS no.14 p.729–31 (3 July 1986); and Czarnul et al., "MOS tunable transconductor," 22 ELECTRONICS LETTERS no.13 p.721-2 (19 June 1986).

Of the many techniques which have been proposed heretofore for making continuous-time monolithic filters, a technique which uses a transconductor differential stage as the base block for the filter is gaining increasing acceptance. Associated with the stage is, of course, an appropriate polarization circuit to provide a bias current to the transconductor stage.

Such a technique has proved especially effective in high-frequency applications. However, conventional transconductor filters also have a drawback in that the transconductance value $g_m$ of the differential stage is dependent on the process variables. (There is normally a significant range of permissible variation in device parameters such as bipolar gain $\beta$, MOS threshold voltages $V_{TN}$ and $V_{TP}$, and sheet resistance of diffusions and of polysilicon.) A further drawback is that the transconductance value $g_m$ of the differential stage is also dependent on the operating temperature (which, again, affects device parameters). In addition, the transconductance value is also dependent on a supply current $I_B$ to the polarization circuit associated with the differential stage.

The variability of the transconductance $g_m$ with the above parameters adversely affects the bandwidth of the transconductor, and hence the attainable width of the filter's passband[3].

[3] Increased bandwidth is one of the important advantages of transconductance amplifiers over op amps. See generally R. Schaumann et al., DESIGN OF ANALOG FILTERS (1990), which is hereby incorporated by reference.

Innovative Suppression of Temperature and Process Dependence

The innovations disclosed herein provide new techniques for suppressing the dependence on temperature, and on the integration process variables, of the transconductance of a transconductor stage, thereby overcoming the limitations with which prior devices have been beset. A further innovative teaching permits realtime digital selection of transconductance values, while retaining independence from temperature and process variables.

The present invention teaches that the value of the supply current $I_B$ to the polarization circuit associated with the differential stage is controlled to compensate for any perturbation of the transconductance value due to temperature and process variables. This is accomplished by circuitry which implements a negative feedback relation. In the presently preferred embodiment, the negative feedback relation controls the bias current, for a transconductor stage having a constant input voltage, to equalize the output current for that stage to the current drawn by a precision current source (referenced to a temperature-independent external resistor). Specifically, as shown in the sample embodiment of FIG. 1, the output of the transconductor stage is connected to an additional current generator (which is referenced to a precision external resistor), to a capacitor, and also to the gate of a PMOS transistor which sources current to a polarization stage, which in turn sources current to the transconductor stage, or to multiple transconductor stages.

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
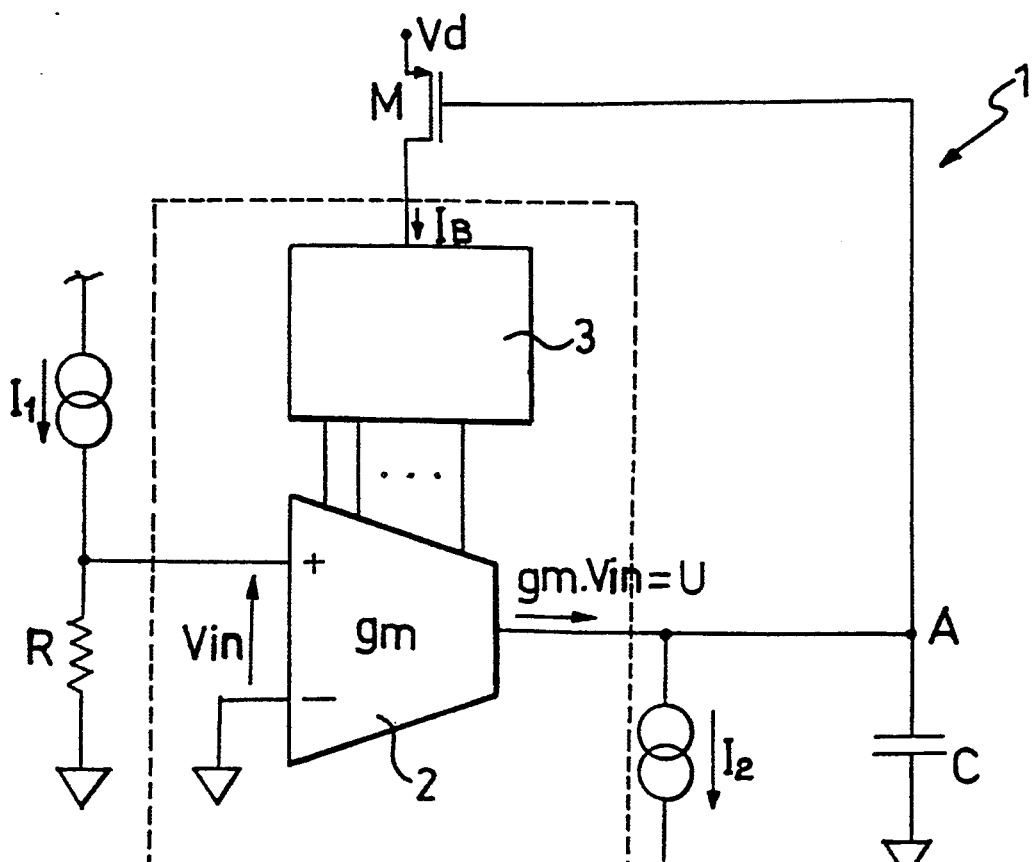
FIG. 1 shows the feedback relation used, according to the innovative teachings of the present application, to improve a conventional transconductor circuit.

FIG. 1 generally and schematically shows an integrated circuit device 1 embodying this invention and effective to suppress the dependence on temperature and variables of the production process[4] of the transconductance $g_m$ of a so-called transconductor stage 2.

[4] Dependence on production process variables means here the effect on transconductance of permissible tolerances in process parameters when the transconductor circuit is made using conventional very large scale integration techniques.

The structure of stage 2 is itself conventional. In the presently preferred embodiment, this stage is preferably fabricated using a mixed technology (i.e. it includes both bipolar transistors and field-effect MOS transistors); but of course other configurations can alternatively be used.

Associated with the stage 2 of FIG. 1 is a polarization circuit 3 connecting said stage to a positive voltage supply node Vd. In addition, the inverting (−) input of stage 2 is connected directly to a reference potential (e.g. ground), while the other, non-inverting (+) input is connected both to the power supply Vd via a current source $I_1$, and to the reference potential (ground) via a resistor R.

Across said inputs, a substantially constant voltage Vin (derived from a constant voltage $V_{BG}$) is applied to produce, on an output U of stage 2, a current signal resulting from the product $g_m \cdot Vin$, where $g_m$ is the transconductance value of stage 2.

As noted above, $g_m$ is not completely precise or constant; instead, $g_m$ is dependent on process variables, temperature, and bias current. The disclosed innovations adjust bias current to remove the dependence on temperature and process variables.

The present invention teaches that the value of the supply current $I_B$ to the polarization circuit associated with the differential stage is controlled to compensate for any perturbation of the transconductance value due to temperature and process variables. This is accomplished by circuitry which implements a negative feedback relation. In the presently preferred embodiment, the negative feedback relation controls the bias current $I_B$, for a transconductor stage 2 having a constant input voltage Vin, to equalize the output current U (=Vin·$g_m$) for that stage to the current drawn by a precision current source $I_2$ ($I_2 = V_{BG}/R_E$, i.e. this current is referenced to a temperature-independent external resistor $R_E$).

Preferably, as shown in the sample embodiment of FIG. 1, the device 1 comprises a negative feedback loop having a uniquely simple structure. In the presently preferred embodiment, this loop is closed across the output U of stage 2 and an input of the polarization circuit 3. Incorporated in the feedback loop are: a current generator $I_2$, a capacitor C, and a transistor M of the MOS type.

Making reference to FIG. 1, it may be noted that the output U of the stage 2 is connected to the reference potential (ground) through the current generator $I_2$ and also through the capacitor C. The connection point is indicated as node A and is connected also to the gate electrode G of the transistor M.

This transistor M is of the p-channel type, and has its source electrode S connected to the voltage supply node Vd and its drain electrode D connected to the input end of the polarization circuit 4 to supply said circuit with a current $I_B$.

As previously mentioned, the transconductance $g_m$ is also dependent on the value of the supply current $I_B$ to circuit 3. Assuming this dependence to be of a proportional nature, it is found that:

$$g_m = K_V \cdot I_B$$

where $K_v$ is a proportionality constant>0.

Figures 5, 6:
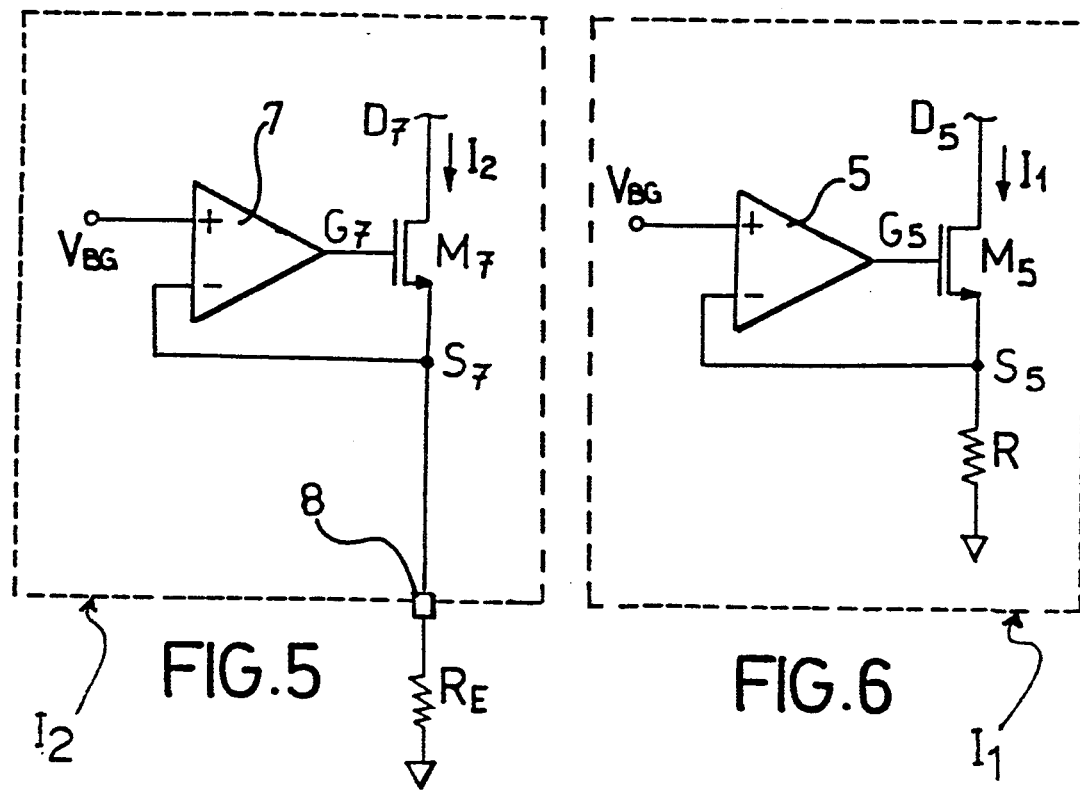
FIG. 5 shows a sample implementation of the current source $I_2$ of FIG. 1.
FIG. 6 shows a sample implementation of the current source $I_1$ of FIG. 1.

FIG. 6 shows a sample realization of the current source $I_1$. "$V_{BG}$" is a constant voltage derived directly from the power supply (e.g. $V_d/2$). Op amp 5 pulls node $S_5$ to voltage $V_{BG}$, so that current $I_1$ is equal to $V_{BG}/R$.[5] The steady state relation is therefore:

[5] Operational amplifier 5 has a non-inverting (+) input supplied with the voltage $V_{BG}$, and has its output connected to the gate electrode G5 of an n-channel MOS transistor M5. The inverting (−) input of amplifier 5 is connected to the source S5 of transistor M5, which is also connected to a reference potential through the resistor R. Current $I_1$ flows through transistor M5 from the drain D5 to the source S5. Note that, if resistor R is an on-chip resistor, it will be affected both by temperature variation and by process variation.

$$Vin = R \cdot I_1 = V_{BG} \quad (1)$$

FIG. 5 shows a sample realization of the current source $I_2$. Op amp 7 pulls node $S_7$ to voltage $V_{BG}$, so that current $I_2$ is precisely equal to $V_{BG}/R_E$.[6]

[6] Operational amplifier 7 has its non-inverting (+) input supplied with a $V_{BG}$ voltage value and its output connected to the gate G7 of a MOS transistor M7. The source electrode S7 of this transistor is connected to the inverting (−) input of amplifier 7, and to a pin 8 of the integrated circuit incorporating the device of this invention. Connected across said pin 8 and the reference potential (ground) is the discrete external resistance $R_E$ (whose value is defined by the user). This resistor is preferably stable over temperature, since this resistor defines the transconductance value $g_m$ obtained through the transconductor stage 2.

Feedback Relations

The feedback loop of device 1 acts on the voltage appearing at node A to equalize the current output U from stage 2 to current generator $I_2$. (If the currents are unequal, the accumulated charge will shift the gate voltage of M to equalize them.) Thus $$g_m \cdot Vin = I_2. \quad (2)$$

However, when the value of Vin from the previous relation (1) is substituted in this relation, it is found that:

$$g_m \cdot V_{BG} = I_2 = V_{BG}/R_E \quad (3)$$

whence it may be seen that the feedback relation forces the transconductance to be $g_m = 1/R_E$. Since $R_E$ is temperature and process-independent, this is a very desirable result.

Consequently, the feedback loop brings the circuit node A to such a voltage level as to bias the transistor M into its active zone. Transistor M thus supplies current $I_B$ directly into the polarization circuit 3 of stage 2. The polarization circuit 3 then accordingly provides bias current inputs to transconductor stage 2 to shift the transconductance value $g_m$ such that $g_m = 1/R_E$, as desired.

Stability

In the embodiment described with reference to FIG. 1, the dynamic resistance across the node A and the reference potential is theoretically an infinite value. However, to ensure stability of feedback loop, the provision of capacitor C is required to introduce in the frequency response a dominant pole useful to make sufficiently low the unitary gain frequency of the feedback loop, if compared to those of the other secondary poles in the feedback loop.

The capacitance of capacitor C is preferably lower than 30 pF, that is, enough to allow integration thereof.

Figure 3:
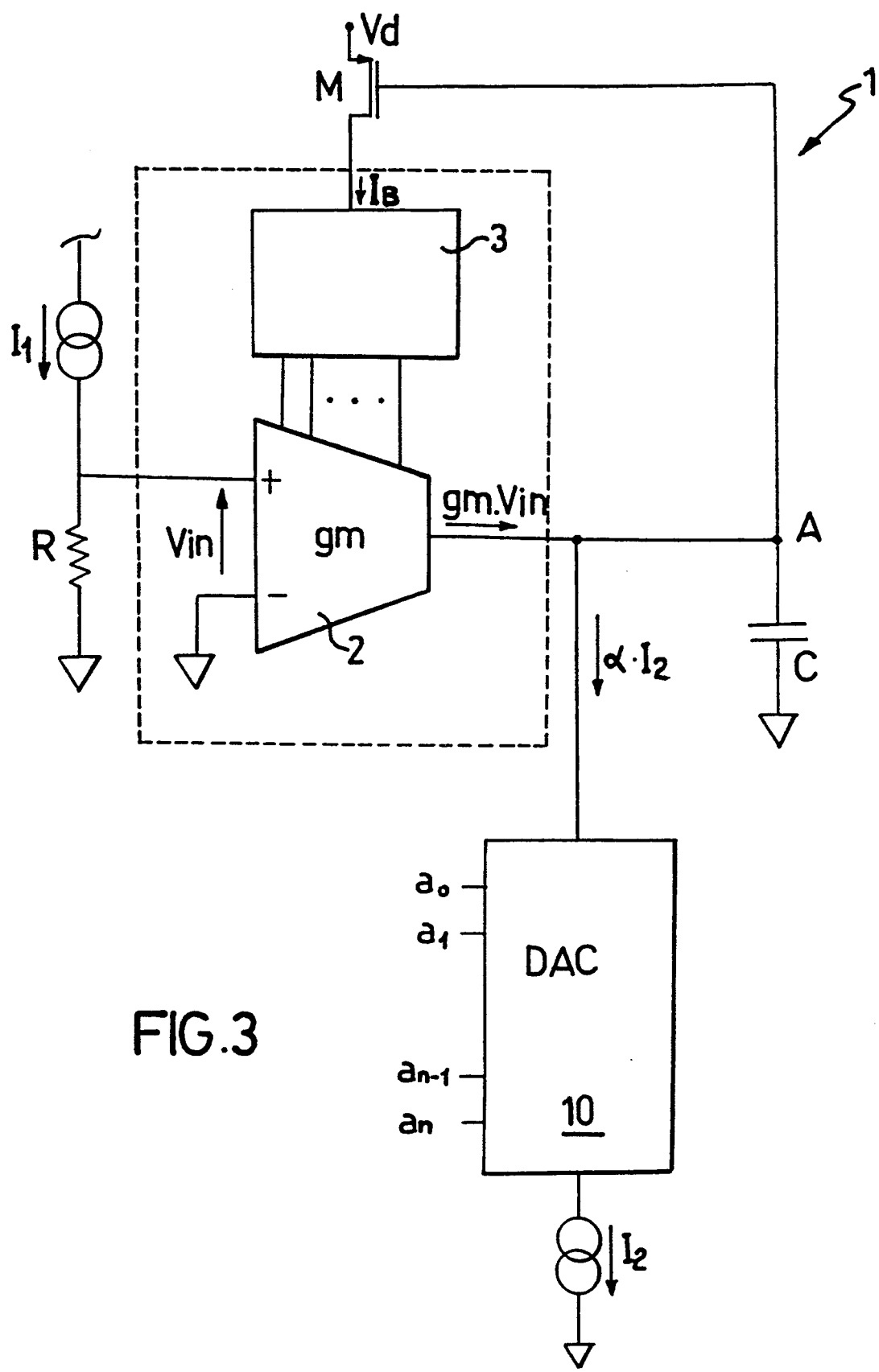
FIG. 3 shows a modified embodiment of the device in FIG. 1, in which the transconductance value is digitally selectable.

Programmable Current Source (FIG. 3)

The precision and stability of the relation $g_m = 1/R_E$ is highly desirable. However, the choice of the external resistance $R_E$ directly controls the transconductance. An alternative (and preferred) embodiment, shown in FIG. 3, provides more flexibility for the user.

In the embodiment shown in FIG. 3, the current source or generator $I_2$ is associated with a DAC (Digital to Analog Converter) converter 10 having a plurality n of digital selection inputs $a_0, a_1, \ldots a_n$. Each of these inputs represents one bit of an n-bit digital word selected by the user, which word allows the value of a multiplier parameter $\alpha$ to be defined. Thus, in this embodiment the current generator $I_2$ is implemented as a variable current generator which provides an output current of $\alpha \cdot I_2$.

The value of $\alpha$ is proportional to the input values in accordance with the following expression:

$$\alpha = a_0 \cdot 2^0 + a_1 \cdot 2^1 + \ldots + a_n \cdot 2^n$$

Revising relations (1) and (2) in the light of the variable current generator $\alpha \cdot I_2$, it is found that:

$$g_m \cdot V_{in} = g_m \cdot V_{BG} = \alpha \cdot I_2 = \alpha \cdot V_{BG}/R_E \quad (4)$$

whence:

$$g_m = \alpha/R_E \quad (5)$$

The transconductance value $g_m$, which is made independent of temperature and process variables by means of the circuit loop according to the invention, can be controlled and set by the user defining the parameter $\alpha$.

The device of this invention has proved effective even where plural transconductor stages were to be operated.

Use of a Transconductor Compensation Stage 2 with Multiple Active Transconductor Stages 4

Figure 4:
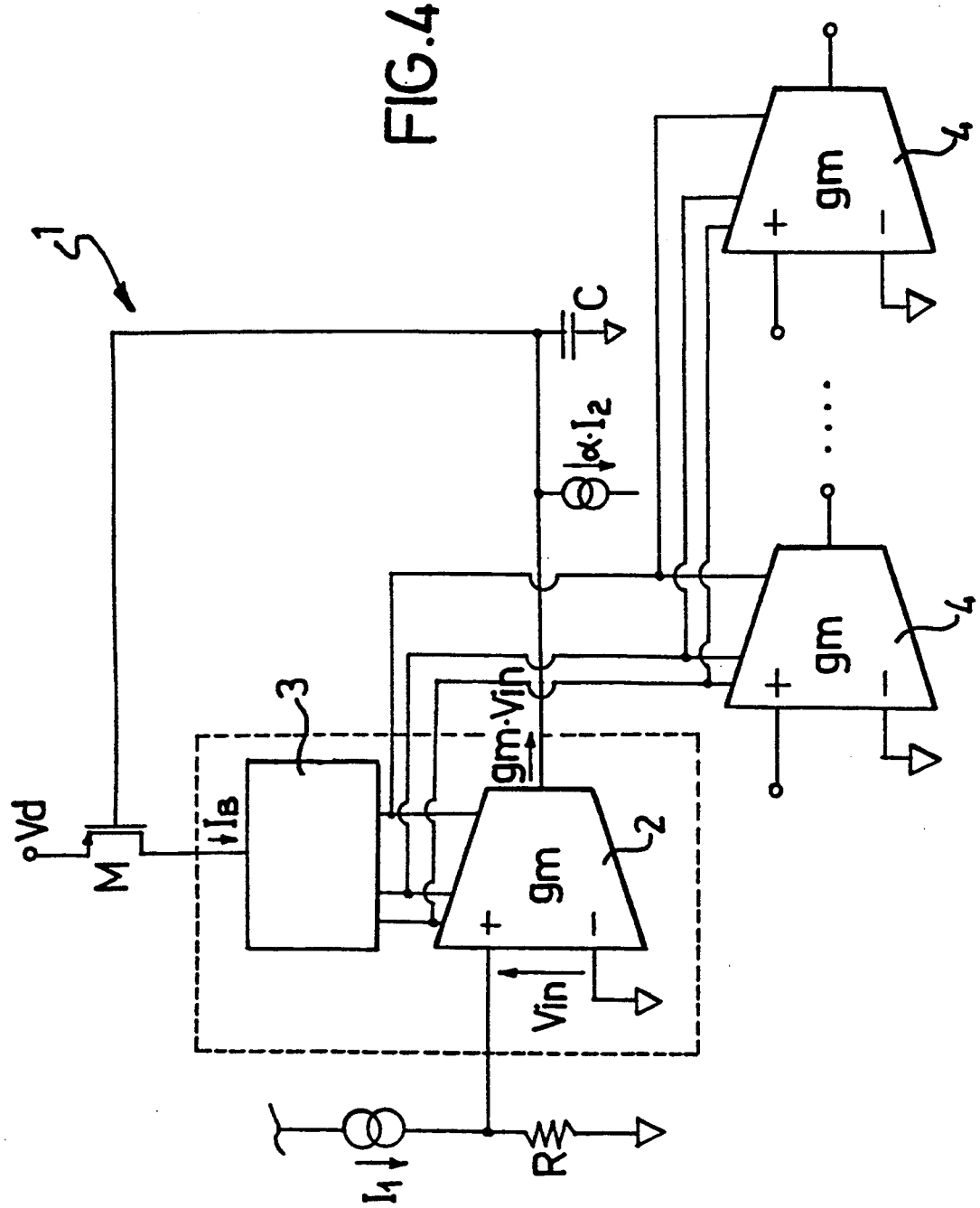
FIG. 4 is a diagram illustrating an exemplary application of the inventive feedback relation to improve the performance of multiple transconductors on a single integrated circuit.

FIG. 4 shows an embodiment of a circuit structure wherein plural stages 4, each having a transconductance value which is nominally the same as that of stage 2, are arranged in parallel and supplied through the same polarization circuit 3. The stages 4 (unlike the "dummy" transconductor stage 2) can receive AC input voltages, and provide corresponding AC output currents. Thus, the stage 2 provides compensated control values which enable all of the stages 4 to achieve correct operation.

Optionally, only one "dummy" transconductor stage 2 can be used to set the correct bias for all transconductor stages 4 on a chip, or at least on a portion of a chip.

Also, where multiple transconductor stages are being controlled in accordance with a single dummy stage 2, it may of course be preferable to distribute voltages rather than currents.

Figure 2:
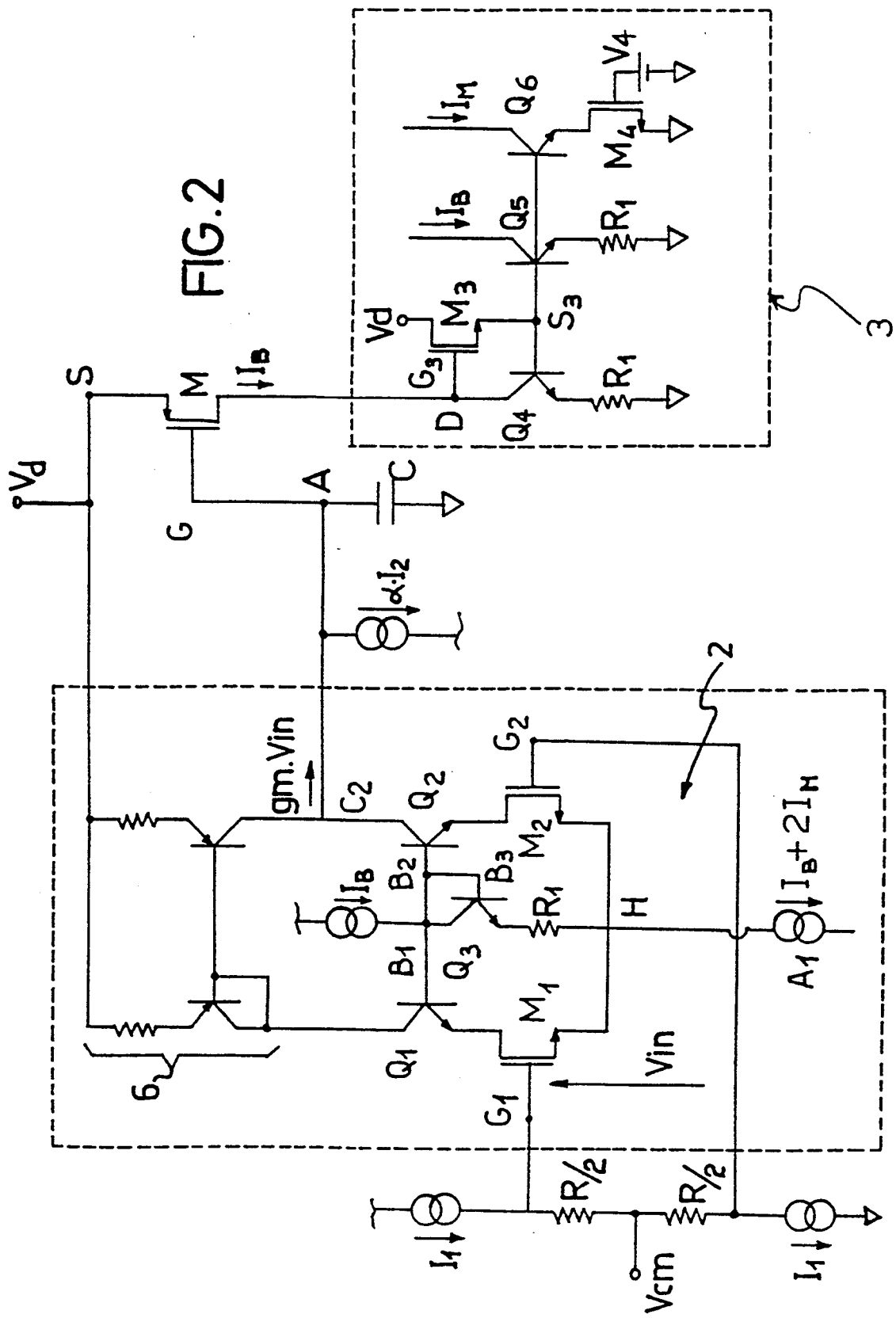
FIG. 2 is a more detailed diagram of a sample specific implementation of the device of FIG. 1.

Sample Specific Implementation (FIG. 2)

For completeness of discussion, a detailed example of the best mode currently contemplated of implementing the inventive device shown in FIG. 2 will be given herein below. The transconductor stage 2 is a differential type comprising an input portion formed of a pair of n-channel MOS transistors M1, M2 which have their source terminals in common and define a circuit node H. Connected between said node and a reference potential is a current source A1, which is controlled in a mirror relationship (from polarization circuit 3) to pass a current equal to $I_B + 2I_M$.

The gate terminal G1 of the first-named transistor, M1, constitutes a non-inverting (+) input for the differential stage. The gate G2 of the second-named transistor, M2, constitutes the inverting (−) input, and the voltage Vin is applied across said inputs.

To avoid distortion phenomena in the output current, the input voltage Vin is applied within the transconductor's linear range through a resistive divider connected across said inputs of stage 2 and composed of a pair of resistors having a value of R/2.

To the junction point of the resistors, a so-called common mode voltage Vcm is applied, with two current sources $I_1$ connecting, on the one side, the non-inverting (+) input to the supply node Vd, and on the other side, the inverting (−) input to a reference potential (ground).

In this way, the input voltage Vin is made to coincide with the previously discussed value $V_{BG}$, but disposed in an exactly differential manner relative to the common mode voltage Vcm.

Stage 2 also includes an output portion comprising a pair of npn bipolar transistors Q1 and Q2 which have their bases connected to each other. These transistors are connected in the stage 2 in a cascode configuration, and the collector C2 of one of them (Q2) constitutes the output terminal U for the differential stage 2.

A third transistor, Q3, of the bipolar type has its base B3 connected to the bases B1, B2, and its emitter connected to the node H via a resistor R1.

A current mirror circuit 6 is adapted to supply to the output A the current value $g_m \cdot V_{in}$ produced by the MOS transistors M1 and M2.

The gate G of the transistor M is connected to collector C2, which is also connected to the reference potential (ground) by the parallel of the variable generator $\alpha \cdot I_2$ and capacitor C. The source S of the same transistor M is connected to the Vd pole.

Finally, the polarization circuit 3 comprises a group of three bipolar transistors Q4, Q5, Q6 having respective bases in common. The two first-named transistors Q4, Q5 in this group have emitters taken to a reference potential (ground), each through a resistor R1, and the third-named transistor Q6 has its emitter connected to the drain of a MOS transistor M4 which has its source grounded and gate connected to a constant voltage generator V4. A further MOS transistor M3 has its gate and source respectively connected to the collector and the base of the first-named bipolar transistor Q4. The gate G3 of this MOS transistor M3 is connected, moreover, to the drain D of transistor M and constitutes an input for the polarization circuit 3. (M3 provides base current compensation for Q4/Q5/Q6.)

The currents $I_B$ and $I_M$ sinked by polarization circuit 3 are mirrored (by current mirror stages which are not shown for simplicity), to control the current $I_B$ which is sourced to node $B_1/B_2$, and to control the current $A_1$ ($=I_B+2I_M$) which is sinked from node H.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For example, the voltage $V_{BG}$ can be provided by a bandgap voltage reference circuit, to provide temperature- and supply-independence.

For example, transistor M in FIG. 1 could alternatively be implemented using a PNP bipolar transistor instead of a FET. (In this case, base current compensation is preferably also used.)

For another example, it is also possible to use a different precision current source $I_2$. Although the temperature-independent external resistor is preferable, it is also possible to realize some of the advantages of the innovations using a trimmed on-chip resistor (or a digitally controlled resistor matrix), combined with some sort of temperature compensation (or with use of so-called ZTC (zero temperature-coefficient of resistance) resistances).

For another example, it is also possible to use a different feedback relation instead of that shown in FIGS. 1 and 2 to control the transconductance of the transconductor stages.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit, comprising:
   a differential transconductor stage, operatively connected to receive an input voltage, and at least one bias current, and configured to source an output current which is linearly dependent on variations in said input voltage, and which is also dependent on said bias current;
   a polarization circuit operatively connected to source said bias current to said transconductor stage;
   a programmable current source, comprising an external precision resistor which is substantially temperature-independent, operatively connected to provide an additional current component, at said current output of said transconductor stage, which is generally proportional to said input voltage divided by the value of said precision resistor;
   a capacitor operatively connected between ground and said current output of said transconductor stage; and
   a P-channel field-effect transistor connected to source current to said polarization circuit, and connected to be controlled by the voltage of said current output of said transconductor stage;
   whereby temperature-dependent current variations in said current output of said transconductor stage are compensated by variations in the current passed by said P-channel field-effect transistor.

2. The integrated circuit of claim 1, wherein said capacitor has a value of less than 30 pF.

3. An integrated circuit, comprising:
   a differential transconductor stage, operatively connected to receive an input voltage, and at least one bias current, and configured to provide an output current which is linearly dependent on variations in said input voltage, and which is also dependent on said bias current;
   a polarization circuit operatively connected to receive a first bias current, and to provide one or more corresponding second bias currents to said transconductor stage;
   a current source operatively connected to receive a substantially constant temperature- and process-independent current, opposite in sign to said output current of said transconductor stage, from said output of said transconductor stage;
   a feedback transistor connected to provide said first bias current to said polarization circuit, and connected to be controlled by the voltage of said output of said transconductor stage;
   whereby temperature-dependent current variations in said current output of said transconductor stage are compensated by variations in the current passed by said feedback transistor.

4. The integrated circuit of claim 3, wherein said feedback transistor is a P-channel field-effect transistor.

5. The integrated circuit of claim 3, further comprising a capacitor operatively connected between ground and said current output of said transconductor stage.

6. The integrated circuit of claim 3, wherein said current source comprises a substantially temperature-independent external resistor.

7. An integrated circuit, comprising:
   first and second transconductor stages, each operatively connected to receive a respective input voltage, and at least one bias current, and configured to provide an output current which is linearly dependent on variations in said input voltage, and which is also dependent on said bias current;
   a polarization circuit operatively connected to receive a first bias current, and accordingly to provide one or more second bias signals to each of said transconductor stages;
   a current source operatively connected to receive a substantially constant temperature- and process-independent current, opposite in sign to said output current of said transconductor stage, from said output of said first transconductor stage;
   a feedback transistor connected to provide said first bias current to said polarization circuit, and connected to be controlled by the voltage of said output of said first transconductor stage;
   whereby temperature-dependent current variations in said current output of said transconductor stage are compensated by variations in the current passed by said feedback transistor.

8. The integrated circuit of claim 7, wherein said feedback transistor is a P-channel field-effect transistor.

9. The integrated circuit of claim 7, further comprising a capacitor operatively connected between ground and said current output of said transconductor stage.

10. The integrated circuit of claim 7, wherein said current source comprises a substantially temperature-independent external resistor.

11. The integrated circuit of claim 7, wherein said second bias signals are current signals.

12. The integrated circuit of claim 7, comprising at least three of said second transconductor stages.

13. The integrated circuit of claim 7, wherein each of said transconductor stages has a differential input.

14. A method for operating a transconductor, comprising the steps of:
(a.) providing a substantially constant voltage to the input of a first transconductor stage, and to a substantially temperature-independent resistance;
(b.) dynamically adjusting bias current to said first transconductor stage in a feedback relation such that the output of said first transconductor stage is made equal to an additional current, derived from said substantially constant voltage and from said substantially temperature-independent resistance, to the output of said first transconductor stage;
(c.) providing bias current to one or more second transconductor stages, corresponding to said bias current provided to said first transconductor stage;
(d.) providing respective voltage input signals to said second transconductor stages, and generating respective corresponding current output signals in each of said second transconductor stages accordingly.

15. A circuit device for suppressing the dependence on temperature and production process variables of the transconductance of a differential transconductor stage incorporating a polarization circuit, comprising a negative feedback loop closed across an output of the stage and an input of the polarization circuit, and including a current generator, capacitor, and at least a transistor.

16. A device according to claim 15, wherein said output is connected to a reference potential through the parallel of said current generator and said capacitor, and to a gate electrode of said transistor.

17. A device according to claim 15, wherein said transistor is a field effect transistor and is connected in said feedback loop with respective drain and source electrodes arranged to interconnect the polarization circuit and a supply voltage pole.

18. A device according to claim 17, wherein said transistor is a p-channel type with a source electrode connected to said voltage pole and a drain electrode connected to the polarization circuit.

19. A device according to claim 15, wherein said current generator has a varying value.

20. A device according to claim 15, wherein said current generator is connected to a digital-to-analog converter having n digital selection inputs, wherethrough the user is enabled to define a multiplier parameter $\alpha$ whose value modulates that of the current generator.

21. A device according to claim 15, wherein said current generator includes an operational amplifier having a non-inverting input supplied with a predetermined voltage value and an output connected to the gate of a MOS transistor, with said transistor having a source connected to the inverting input of the amplifier.

22. A device according to claim 21, wherein said source is connected to a reference potential through a resistance having a stable value with temperature.

23. A circuit device for suppressing the dependence on temperature and production process variables of the transconductance of a plurality of differential transconductor stages being supplied in parallel from a polarization circuit, comprising a negative feedback loop closed across an output of one of said stages and an input of the polarization circuit and including a current generator, capacitor, and at least a transistor.

24. A device according to claim 23, wherein said output is connected to a reference potential through a parallel of said current generator and said capacitor, and to the gate electrode of said transistor.

* * * * *